Aug. 3, 1971 HUNG C. CHANG ET AL 3,597,269

SURFACE STABILIZATION OF SEMICONDUCTOR POWER DEVICES AND ARTICLE

Filed Sept. 30, 1969

WITNESSES

Edwin E. Bassler

Donald M. Winegar

INVENTORS
Hung C. Chang &
John W. Ostroski
BY
?. ?. Menzemer
ATTORNEY

United States Patent Office
3,597,269
Patented Aug. 3, 1971

3,597,269

SURFACE STABILIZATION OF SEMICONDUCTOR POWER DEVICES AND ARTICLE

Hung C. Chang, Monroeville, and John W. Ostroski, Pittsburgh, Pa., assignors to Westinghouse Electric Corporation, Pittsburgh, Pa.

Filed Sept. 30, 1969, Ser. No. 862,418
Int. Cl. B44d *1/18*; H01l *3/00*
U.S. Cl. 117—213 12 Claims

ABSTRACT OF THE DISCLOSURE

Exposed surfaces of a body of semiconductor material having a portion of a PN junction exposed therein are etched and then cleaned with either a solution of iodine or a solution of iodine and iodine pentoxide. Immediately prior to depositing a dielectric film of silicon dioxide-silicon nitride to overlie the cleaned exposed PN junctions, adsorbed iodine is removed from the body by hydrogen gas. A resinous protective coating material is applied to the dielectric film to afford mechanical and electrical protection.

BACKGROUND OF THE INVENTION

(1) Field of the invention

Figure 1:
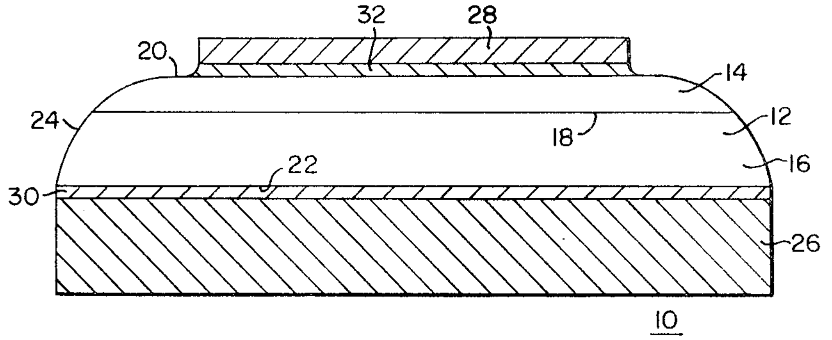

This invention relates to the stabilization of surfaces of bodies of semiconductor material.

(2) Description of the prior art

At the present time the usual practice for stabilization of surfaces of a body of semiconductor material consists basically of a four step process. The electrical charactersitics of a semiconductor body are stabilized by etching and cleaning the surface in order to remove microdefects, contamination, and chemisorbed substances. Efforts are required to preserve this cleaned surface for further processing. A thin layer of a dielectric material such as silicon dioxide is applied to the clean surface. A sufficiently thick dielectric overcoating such as a resin which is relatively impermeable to moisture and harmful impurities is applied to the thin layer of dielectric material to protect it mechanically and electrically. The processed body of semiconductor material is then hermetically encased in a capsule with only electrical leads and a heat sink being exposed to the outside of the capsule. Sometimes the electrical field at a passivated junction surface is made much less than the charge in the bulk of the semiconductor material by beveling the junction surface.

While efforts have been made to provide a thin layer of dielectric material consisting of silicon oxide-silicon nitride of a sufficient thickness to provide mechanical stability for both passivation and protection of the exposed surfaces, numerous shortcomings and difficulties have been encountered in that it is easily damaged.

An object of this invention is to provide a thick dielectric overcoating of certain resinous materials for the mechanical and the electrical protection of a layer of silicon oxide-silicon nitride dielectric material covering the exposed surfaces of a body of semiconductor material which contains a PN junction.

A further object of this invention is to provide a process for etching a body of semiconductor material, applying an iodine quench to clean the surface of the body of the etched semiconductor material, treating the surface with hydrogen gas for removing the iodine and any other impurities from the surfaces and depositing a thin layer of silicon oxide-silicon nitride dielectric material on the cleaned surface of the body.

A still further object is to treat in one continuous operation an iodine cleaned semiconductor in hydrogen up to 600° C., then deposit silicon oxide and silicon nitride layers.

SUMMARY OF THE INVENTION

In accordance with the teachings of this invention there is provided a process for stabilizing a selected surface area of a body of semiconductor material whereat a portion of at least one PN junction is exposed. The preselected surface area is chemically etched and then cleaned in an anhydrous solution of at least one material selected from the group consisting of iodine and iodine with iodine pentoxide. Adsorbed iodine is removed from the surface area of the body by hydrogen gas at an elevated temperature not exceeding about 600° C. A layer of silicon dioxide is deposited on the exposed PN junction and a layer of silicon nitride is deposited on the layer of silicon nitride. The semiconductor device produced by this process is novel. A layer of silicon dioxide overcoated with a layer of silicon nitride is grown on the surface and the PN junction contained therein. To protect the layers of silicon dioxide and silicon nitride an overcoating of a protective coating material is applied to the silicon nitride layer. If the surface of the body of the termination of the PN junction contained therein is cleaned with an anhydrous solution of iodine and iodine pentoxide, the chemisorbed iodine materials are removed by hydrogen as part of the growing process for the silicon dioxide and silicon nitride layers.

The semiconductor device produced by this process is novel.

DRAWINGS

Figure 2:
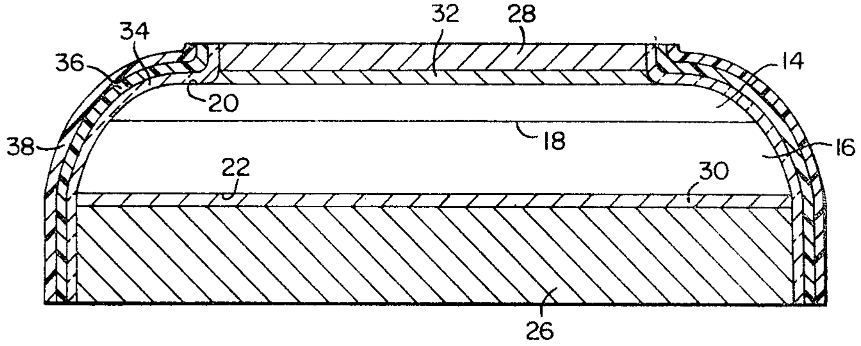

For a better understanding of the nature and objects of this invention, reference should be had to the following drawings in which FIGS. 1 and 2 are views in cross-section of a body of semiconductor material being processed in accordance with the teachings of this invention.

DESCRIPTION OF THE INVENTION

In FIG. 1 there is shown a semiconductor element 10 comprised of a body 12 of semiconductor material having at least two regions 14 and 16 of opposite type semiconductivity and a PN junction 18 therebetween. The body 12 has two major opposed surfaces 20 and 22 and a contoured side surface 24 produced by lapping and pre-etching. For silicon the usual etchant comprises a buffered solution of hydrofluoric acid. Other acids can be used. The body 12 is comprised of a suitable semiconductor material such, for example, as silicon, silicon carbide, germanium, compounds of Group III and Group V elements, and compounds of Group II and Group VI elements. A support electrode 26 and an electrical contact 28 are joined by suitable solder layers 30 and 32 respectively in an ohmic electrical conductive relationship with the body 12. Suitable materials for the electrode 26 and the contact 28 are molybdenum, tungsten, tantalum, and base alloys thereof. Examples of suitable solder materials for the layers 30 and 32 are gold, an alloy of aluminum and boron and a silver-lead-antimony alloy. The electrode 26 and the contact 28 may be joined simultaneously to the body 28. The element 10 is etched by suitable means such, for example, as spin etching to remove the surface 24 damage of the body 12. The mixtures of oxide, hydroxide and fluoride groups and metal ions resulting from the lapping pre-etching and etching contribute to the surface instability of the body 12 and are removed by quenching in a non-aqueous iodine solution as will be described in detail hereinafter.

In accordance with this invention a method employed when the element 10 is to undergo in-process checking, a temporary passivation of the surface 24 comprises quenching the element 10 by dipping it immediately in a non-aqueous solution of iodine after the etching dip. The exposed surface 24 is cleaned and a temporary passivated surface is provided by such quenching of the element 10 in a saturated solution of pure iodine in an anhydrous solvent such, for example, as acetone, carbon tetrachloride, chloroform, isopropyl alcohol, or methanol. A preferred solvent is methanol because of its low cost. The iodine-methanol solution contains from 10 to 20 grams of iodine in each 100 milliliters of methanol. Alternately, the element 10 is quenched in a solution of iodine and iodine pentoxide after etching. The solution consisting of for example from 10 to 20 grams of iodine and from 0.2 to 5 grams of iodine pentoxide in 100 milliliters of methanol.

The excess iodine is rinsed from the semiconductor element 10 by a fresh iodine solution to remove any remaining acid from the etching solution which would form a contaminated iodine film. The element 10 is then rinsed well with acetone to remove any excess free iodine thereby leaving only a tightly-bound chemisorbed iodine on the atomically clean surface 24 of the body 12. Similarly excess iodine and iodine pentoxide are removed by one or more rinses of acetone. This tightly bound chemisorbed iodine forms the temporary passivation layer which is essentially a monotomic layer, with iodine atoms joined to silicon atoms at all exposed surfaces on which the layer is formed.

The iodine prevents the formation of oxides on the treated surfaces as well as displacing the hydroxides and the fluorides resulting from the etching process. Since the fluorides and metal ion complexes present on the surface 24 after etching are absorbates which are detrimental to the stability of the electrical properties of the surface 24, the removal of these absorbates produces an ideal surface for passivation.

Another alternate method of processing the element 10 to clean the surface 24 after etching and to form the temporary passivation layer is to rinse the element 10 in the iodine solution after etching of the exposed PN junction 18 followed by rinsing the element 10 in a solution of iodine and iodine pentoxide, the composition of the solution being the same as described heretofore and at least once with acetone to form the substantially monotomic layer of iodine and iodine pentoxide bonded to silicon atoms of the exposed surfaces of the body 12.

Upon completion of the cleaning of the surface 24 and the formation of the temporary passivation layer, the element 10 is ready for testing to evaluate the electrical properties of the element 10. Electrical testing determines which elements need reworking, or scrapping, and which elements are suitable for further processing. When an element 10 has been found suitable for further processing it is placed in a horizontal position on a susceptor within a growth apparatus suitable for the growth of a dielectric film of silicon dioxide-silicon nitride by suitable means well known to those skilled in the art.

In all instances care is exercised to prevent the electrode 26 and the contact 28 from separating from the body 12 during the dielectric film growth process. Since some iodine is present on the surface 24 it must be removed before the growth of the dielectric film. An example of the method of this invention of removing the iodine and other contaminations from the surface 24 is to slowly heat the dielectric film growth apparatus while causing ultrapure hydrogen gas to flow over and about the element 10 in the apparatus. Suitable ultrapure hydrogen gas has a total impurity concentration of less than 10 parts per million. The flow rate of the ultrapure hydrogen is about 20 cc./min. The iodine, or iodine and iodine pentoxide, or iodine, oxides and other contaminations, are removed by reaction and/or sublimation into the hydrogen gas flow to be carried away, which includes the formation of hydrogen iodide. Mass reaction occurs to produce the hydrogen iodide because of the abundance of hydrogen gas present. An additional benefit of this treatment is that a mass reaction also occurs between hydrogen and any oxides or contaminants which may also be present on the surface resulting in the formation of other hydrogen compounds which are removed by excess hydrogen gas. An initial low temperature with a slow temperature rise to the dielectric film growth temperature is required since the higher the temperature becomes, the stronger the bonding between silicon and iodine. A rate of temperature rise of 50° C. per minute for 10 minutes to a minimum temperature of 500° C. and not over about 600° C. has been found satisfactory to cleanse the iodine and traces of impurities from the surface 24. Compared to vacuum sublimation of the iodine from the surface 24, the process of this invention has been found to produce the better results.

The temperature of the apparatus is then increased to about 600° C. and the apparatus is flushed with argon. Ultrapure oxygen, that is oxygen having less than 10 parts per million of impurities contained therein is caused to flow over and about the element 10 in the apparatus at a rate of 0.5 liter per minute. A gaseous mixture of 3% by volume of silane and 97% hydrogen gas is then introduced into the apparatus to flow over and about the element 10 at the same time as the oxygen. The silane-hydrogen gaseous mixture has a gas flow rate of 100 cubic centimeters per minute. The oxygen to silane ratio is approximately 170 to 1 and deposits silicon dioxide on the wafer. The deposition of silicon dioxide is continued for approximately five minutes to produce a layer 34, FIG. 2, of from 500 A. to 550 A. of silicon dioxide at a rate of approximately 110 A. per minute.

The silane flow is terminated first and then the flow of the oxygen is terminated. The apparatus is purged by continuing the flow of hydrogen at a rate of 50 liters per minute for approximately two minutes to remove all the oxygen from the apparatus. The hydrogen flow is reduced to approximately 40 liters per minute and the element 10 brought up to a temperature of about 700° C. Ammonia gas at a rate of 10 liters per minute is caused to flow through the apparatus over and about the element 10. A mixture of 15% by volume silane gas and the remainder hydrogen is caused to flow at a rate of approximately 1333 cubic centimeter per minute through the apparatus over and about the element 10. The ratio of ammonia to silane is about 50 to 1. The gas flows are continued for approximately 18 minutes and a layer 36, FIG. 2, of silicon nitride about 2000 A. in thickness is grown at a rate of about 125 A. per minute on the silicon dioxide layer 34. The silane gas flow is stopped first followed by stopping the gas flow of the ammonia. The hydrogen gas flow is reduced to about 5 liters per minute and the dielectric film consisting of layers 34 and 36, is stress relieved at 700° C. for a minimum of 5 minutes.

The element 10 is cooled by reducing the RF power to zero in three minutes in a hydrogen gas flow of 5 liters per minute and until a temperature of about 75° C. is reached. Argon gas is then caused to flow through the apparatus while the hydrogen gas flow is stopped. Cooling in argon gas continues until room temperature is reached.

The element 10 is removed from the apparatus and the grown dielectric film is lapped from the surfaces of the electrode 26 and the contact 26 to which electrical connections are to be made when the element 10 is assembled into an electrical device. The resulting structure is shown in FIG. 2.

As grown the dielectric film damages very easily during handling of the element 10. Protection of the dielectrict film 36 is necessary to preserve the improved electrical characteristics of the element 10 derived from the dielectric film. As shown in FIG. 2, a layer 38 of a protective coating material is disposed on the dielectric film 36 to afford it mechanical protection. The material of the layer 38 must be relatively impermeable to moisture and metal ions, adhere well to the silicon nitride material and to the metallic parts, introduce minimum strain to the surface 24 and sustain the operating temperature of the element 10 without degrading the thermal stability of the element 10. The protective coating material should also be flexible enough to endure thermal cycling of the element 10 without fracturing the layer 38 or separating the layer 38 from the layer 36 of silicon nitride. Suitable coating materials are high temperature resinous compositions, and preferably solid perfluorohydrocarbons, such, for example, as polytetrafluoroethylene and trifluoromonchloroethylene, cured solid, infusible and insoluble aromatic polyimides, cured, solid, infusible and insoluble aromatic polyamide-polyimides, a cured, fused insoluble copolymer consisting of both imide and benzimidazole linkages, and paralene resins.

Particularly good results are obtained when the material of the layer 38 is a high temperature coating material selected from the group consisting of aromatic polyimides and aromatic polyamide-polyimides. The material of the layer 38 is preferably applied to the preselected passivated surface area of the treated body 12 as a solution in a volatile solvent of a resinous polymeric intermediate. The treated body 12 with the applied material in solution form is then heated to convert the resinous soluble polymer intermediate to a cured, solid, infusible and in soluble polyimide or a polyamide-polyimide polymer.

The solution is prepared by disposing a soluble precursor of an aromatic polyimide or an aromatic polyamide-polyimide in a suitable solvent such, for example, as dimethylacetamide and N-methyl prollidone. Further details on the preparation and cure of aromatic polyimides may be found in the teachings of U.S. Pats. 3,179,614 and 3,179,634. Details and the preparation of some of the aromatic polyamide-polyimides are taught in U.S. Pat. 3,179,635. Further details as to suitable solvents and curing for both aromatic polyimides and aromatic polyamide-polyimides are taught in the three aforementioned U.S. patents.

A suitable resinous aromatic amide-modified polyimide material for the layer 38 has the repeating unit:

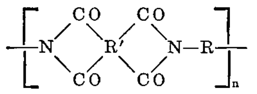

in which $n$ is an integer of at least 5 and R represents a divalent radical selected from the group consisting of:

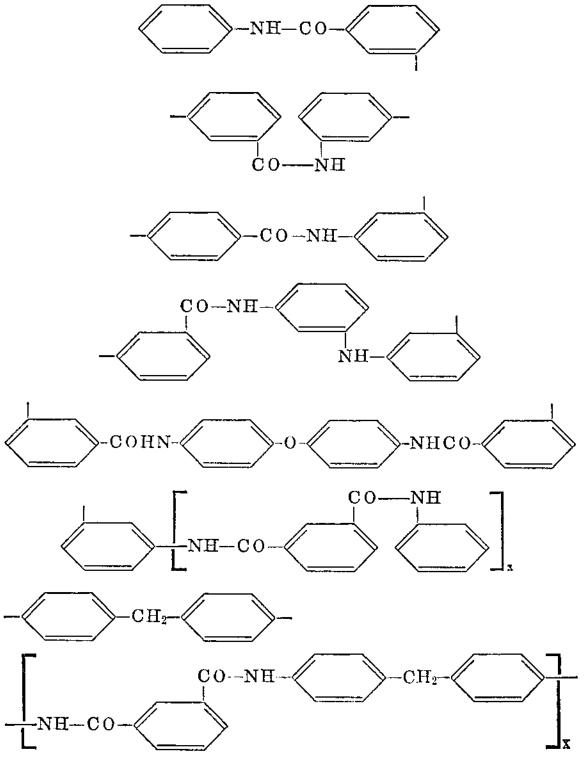

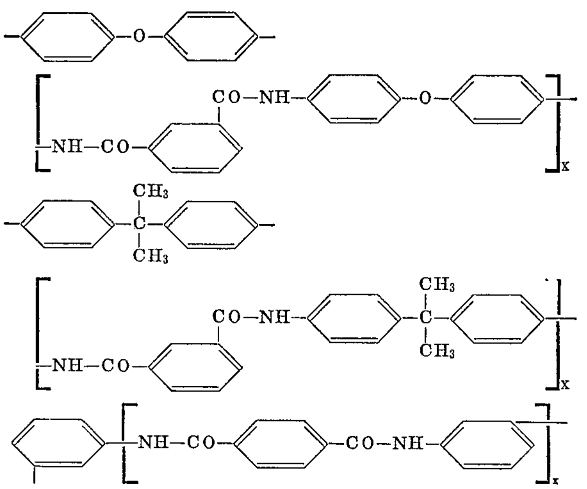

in which $x$ is an integer of from 1 to about 500, and in which R′ represents a tetravalent radical selected from the group consisting of:

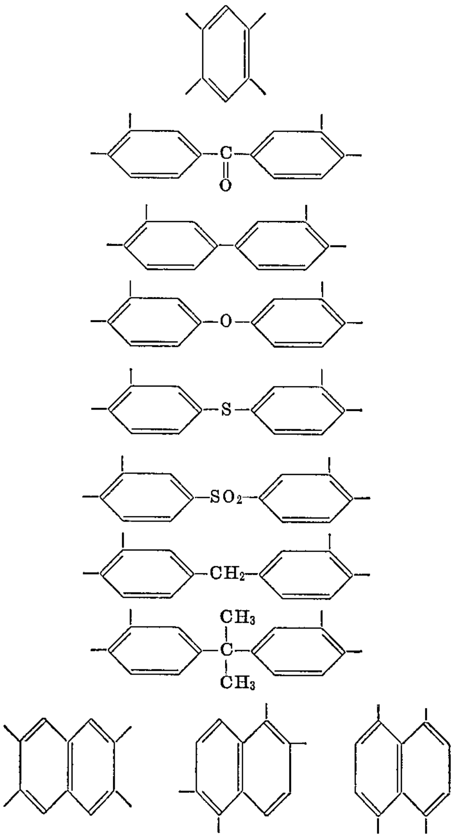

Another suitable resinous amide-modified polyimide for the material of layer 38 is one having the repeating unit:

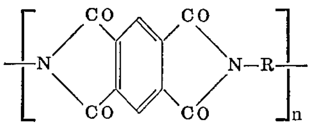

in which $n$ is an integer of at least 5 and R represents a divalent radical selected from the group consisting of:

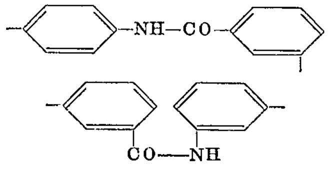

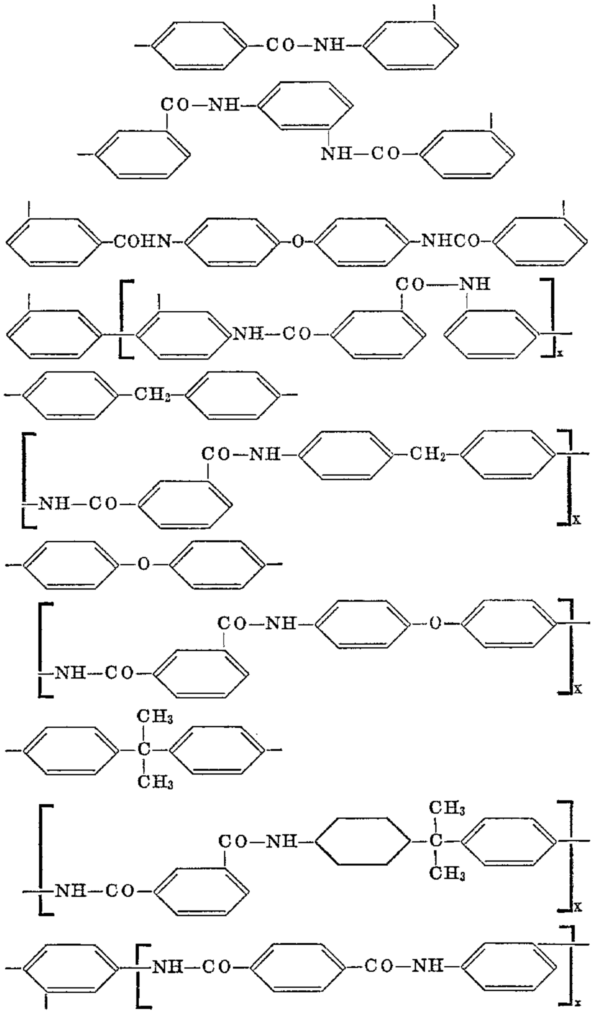

in which $x$ is an integer of from 1 to about 500 and another suitable amide-modified polyimide when cured has the repeating unit:

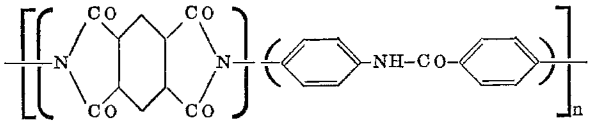

wherein $n$ is an integer of at least 5.

Other suitable resinous aromatic amide-imide polymers suitable for the material of the layer 38 contain the repeating unit:

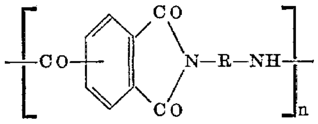

where $n$ is an integer of about 50 to 15,000 and R is a divalent organic radical composed only of H, C, N, S, and O, for example only divalent radical selected from the group consisting of:

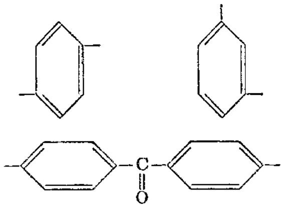

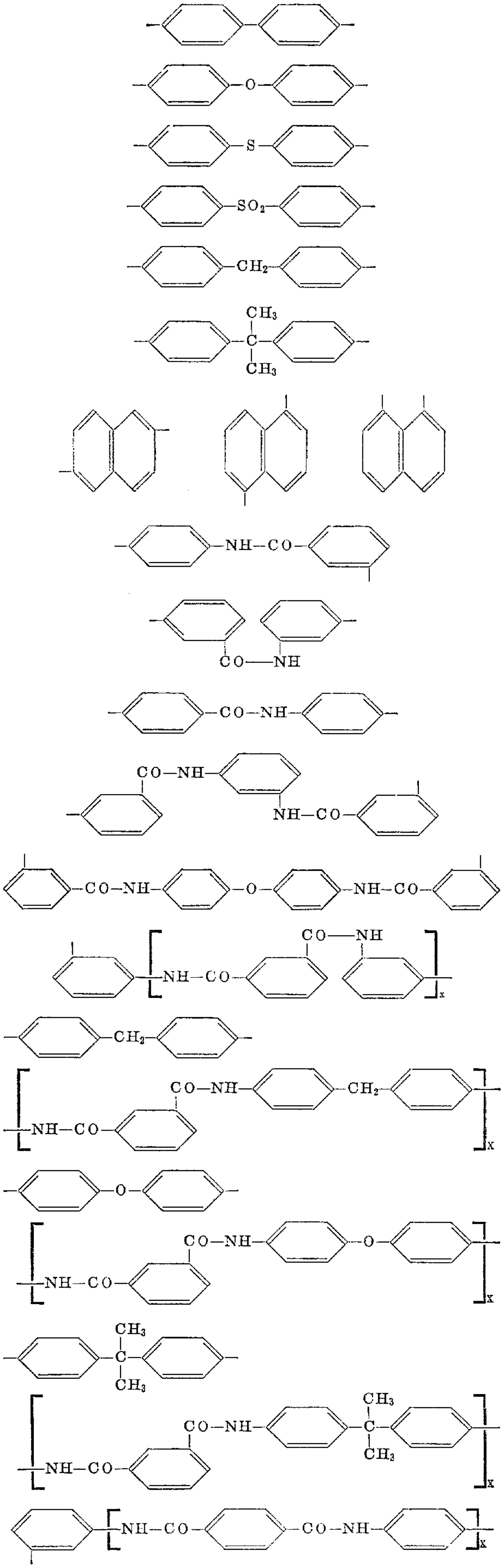

in which X is an integer of from 1 to about 500. Copolymers containing two or more of the radicals are also suitable for the material of layer.

Suitable resinous polyimides which may be used to from the layer 38 have the recurring unit:

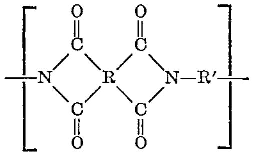

where R is a tetravalent radical containing at least one ring of six carbon atoms, the ring being characterized by benzenoid unsaturation, the four carbonyl groups being attached directly to separate carbonyl atoms in a 6 membered benzenoid ring of the R radical and each pair of carbonyl groups being attached to adjacent carbon atoms in a ring of R radical; and wherein R′ is a divalent radical selected from the group consisting of:

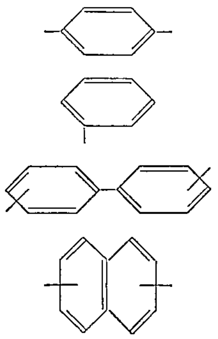

and

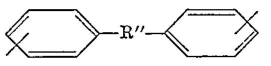

wherein R″ is selected from the group consisting of an alkylene chain having from 1 to 3 carbon atoms,

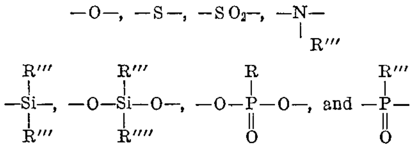

wherein R‴ and R⁗ are selected from the group consisting of alkyl and aryl.

The polyimides and polyamide-imides referenced heretofore form a film for the layer 38 which has high tensile properties, desirable electrical properties, stability to heat and water, high resistance to radiation damage, and good adherence to the silicon nitride.

The thickness of the layer 38 is determined by the voltage and current rating of the body 12 of semiconductor material. It is desirable, however, that the layer 38 by a minimum of approximately 0.003 inch in thickness. For a 2000 volt diode a thickness of about 0.006 inch is satisfactory.

It is desirable that the layer 38 be formed by curing the applied material in a continuous series of heating steps involving increments of increasing temperature. This is practiced to prevent blistering of the layer 38 which may occur by the entrapment of water vapor or alcohol, one or the other being a reaction product formed by the curing of the polyimide and polyamide-polyimide materials. A preferred heating cycle to cure the applied material is as follows: place the coated semiconductor element in an air circulating furnace and heat at 100° C. for one hour minimum; then raise the furnace temperature to 150° C. and continue heating for an additional ½ hour minimum; then raise the furnace temperature to 200° C. and continue heating for an additional ½ hour minimum; and finally raise the furnace temperature to the recommended maximum curing temperature for the particular material of the coating layer 38 and continue heating for a period sufficient to complete the polymerization of the material. In practice the total curing time is from 4 to 5 hours.

The cured material of the layer 38 forms a film which is adherent to the surface of silicon nitride and is resistant to abrasion and scratching.

It has been found that where the cured material of the layer 38 has a repeating unit:

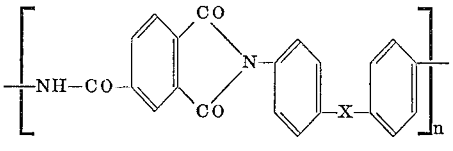

where X is a radical selected from the group consisting of —$CH_2$— and —O—, and $n$ is an integer of from 10 to 100, the final furnace temperature is approximately 300° C. and preferably from 250° C. to 280° C. The film is tough, flexible and has good thermal stability permitting the element 10 to operate at a junction temperature in excess of 200° C.

A cured, fused, insoluble copolymer consisting of both imide and benzimidazole linkages prepared from soluble polymeric precursors or intermediate by heating or by a chemical curing process is also suitable for making the coating 38. Upon curing the benzimidazole-imide copolymer has at least one benzimidazolyl group and consists essentially of the recurring unit:

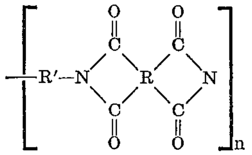

wherein $n$ has a value of from about 10 to about 200,000.

R is at least one tetravalent organic radical in which the four bonds are so arranged that the imide rings contain either five or six members. The five or six members of the imide rings are selected from the group consisting of:

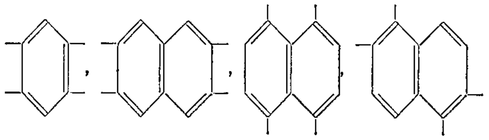

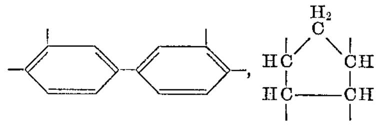

and

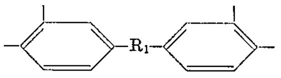

$R_1$ in the recurring unit is a divalent radical selected from the group consisting of aliphatic hydrocarbon radicals having from one to four carbon atoms and alkyl and aryl substituted silane and siloxane radicals and oxy, carbonyl, sulfonyl, sulfide, amide, benzimidazolyl, keto, benzoxazolyl and ester radicals.

R′ is a divalent organic radical containing one or more benzimidazole groups selected from the group consisting of:

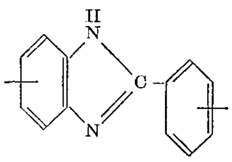

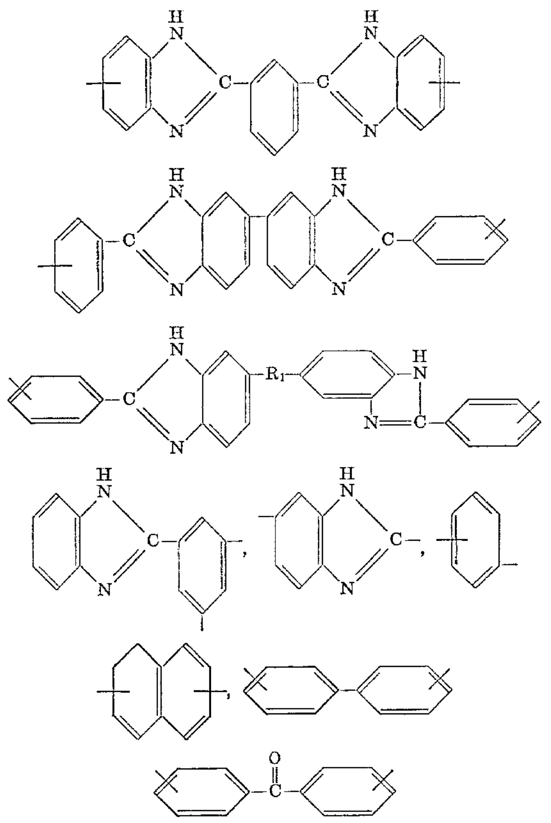

and

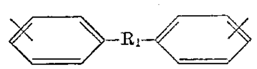

A soluble resinous polymeric intermediate from which the cured, fused, insoluble copolymer may be prepared comprises the condensation product of at least one aromatic primary amine, a triaminobenzanilide, and a dianhydride. Suitable aromatic primary amines are:

5,4'-diamino-2-phenylbenzimidazole
5,3'-diamino-2-phenylbenzimidazole
2,2'-(m-phenylene)-bis-(5-aminobenzimidazole)
2-(3',5'-diaminophenyl) benzimidazole
bi {5-[2-(m-aminophenyl) benzimidazolyl]}
5,5'-oxybis [2-(p-aminophenyl) benzimidazole]
2,2'-(2,6-naphthylene)-bis-(5-aminobenzimidazole)
2,6-bis (4-aminophenyl) benzo [1.2.4.5] bisimidazole
2,7-bis (3-aminophenyl)naphtho [2.3.6.7] bisimidazole Suitable dianhydrides are the pyromellitic dianhydrides.

3,3',4,4'-benzophenonetetracarboxylic dianhydride
3,3',4,4'-biphenyltetracarboxylic dianhydride
bis(3,4-dicarboxyphenyl) ether dianhydride
bis(3,4-dicarboxyphenyl) sulfide dianhydride
bis(3,4-dicarboxyphenyl) sulfone dianhydride
bis(3,4-dicarboxyphenyl) methane dianhydride
2,2-bis(3,4-dicarboxyphenyl) propane dianhydride
2,3,6,7-naphthalenetetracarboxylic dianhydride
1,2,5,6-naphthalenetetracarboxylic dianhydride
and 1,4,5,8-naphthalenetetracarboxylic dianhydride.

If desired, layer 38 may include a filler material, preferably an electrically insulating material having the same dielectric constant as, or less than that of the protective coating. The filler is uniformly distributed throughout the polyimide, polyamide-polyimide and the benzimidazole-imide copolymer materials of the layer 28. Suitable electrically insulating materials, in finely divided or pulverized form, which can be used as a filler material are aluminum oxide, silicon oxide, glass fibers, boron nitride, quartz, mica, magnesium oxide and reactivated polytetrafluoroethylene.

The electrically insulating filler material preferably should not exceed about 64 percent, by volume, of the layer 38. A preferred range of from 40 percent to 50 percent by volume is desirable as this proportion of filler material and the protective coating material has the best working consistency.

With either a filled or unfilled polyimide, polyimide-polyamide, or a benzimidazole-imide copolymer material, the electrical properties of the element 10 is improved and the element's functional operating temperature range increased to a range extending from approximately −100° C. to approximately 200° C. Additionaly, the hardness, the abrasion and scratch resistance, the adhesive capability, and the thermal stability of the material of the layer 38 makes it a suitable material as a protective coating layer for the dielectric film of silicon oxide and silicon nitride.

A suitable parylene resin for the layer 38 is one selected from the group consisting of poly-p-xylylene, polymonochloro-p-xylylene, poly-cichloro-p-xylylene, poly-ethyl-p-xylylene, poly-methyl-p-xylylene, poly-cyano-p-xylene, and poly-bromo-p-xylylene.

Diodes manufactured in accordance with the teachings of this invention exhibit reverse leakage currents of less than 50 microamperes at 2400 volts and 25° C. At 175° C. the reverse leakage currents are less than 8 milliamperes at 2000 volts. There is no indication of forward voltage drop deterioration. The protective coating material has preserved the desirable electrical characteristics achieved by the dielectric film growth process and the process of growing the dielectric film can be modified to remove iodine material when necessary from the semiconductor body prior to the dielectric film growth.

We claim as our invention:

1. A process for stabilizing a selected surface area of a body of semiconductor material whereat a portion of at least one PN junction is exposed comprising the process steps of:

(1) etching the preselected surface area of the body of semiconductor material whereat the portion of said at least one PN junction is exposed;

(2) cleaning the preselected surface area of said body in an anhydrous solution of at least one material selected from the group consisting of iodine, and iodine with iodine pentoxide followed by rinsing off the solution;

(3) removing adsorbed iodine from the body by hydrogen gas at an elevated temperature not exceeding about 600° C.;

(4) depositing a layer of silicon dioxide on at least said preselected surface area; and (5) depositing a layer of silicon nitride on said layer of silicon dioxide.

2. The process of claim 1 wherein the process steps of removing of the material comprising at least iodine from the preselected surface area and the depositing of the layers of silicon dioxide and silicon nitride are performed in one continuous furnace operation.

3. The process of claim 2 including the step of overcoating the layers of silicon dioxide and silicon nitride with a protective coating material selected from the group consisting of solid perfluorohydrocarbons, cured resinous aromatic polyimides, cured resinous aromatic polyamide-polyimides, cured resinous benzimidazole-imide copolymers, and a parylene resin.

4. The process of claim 3 wherein the protective resinous coating material includes up to 64% by volume of an electrically insulating material comprising at least one finely divided material selected from the group consisting of aluminum oxide, aluminum nitride, silicon dioxide, silicon nitride, boron nitride, magnesium oxide, glass fibers, quartz, mica, and reactivated polytetrafluoroethylene.

5. The process of claim 1 wherein the anhydrous solution consists of from 10 to 20 grams of iodine in each 100 milliliters of methanol and the iodine material is removed from the preselected area by heating the body at an increasing rate of 50° C. per minute for 10 minutes to a minimum of 500° C. but not over about 600° C. at a gas flow rate of about 20 liters per minute.

6. The process of claim 1 wherein the anhydrous solution also consists of from 0.2 to 5 grams of iodine pentoxide.

7. The process of claim 3 wherein the anhydrous solution consists of from 10 to 20 grams of iodine in each 100 milliliters of methanol and the iodine material is removed from the preselected area by heating the body at an increasing rate of 50° C. per minute for 10 minutes to a minimum of 500° C. but not over about 600° C. at a gas flow rate of about 20 liters per minute.

8. The process of claim 3 wherein the anhydrous solution also consists of from 0.2 to 5 grams of iodine pentoxide.

9. As an article of manufacture, a body of semiconductor material including at least one PN junction terminating at a surface thereof, a layer of silicon dioxide disposed on the surface of the body and overlying said at least one PN junction, a layer of silicon nitride disposed on the layer of silicon dioxide, and a layer of a protective coating material disposed on the layer of silicon nitride, said protective coating material being selected from the group consisting of solid perfluorohydrocarbons, cured resinous aromatic polyimides, cured resinous aromatic polyamide-polyimides, cured resinous benzimidazole-imide copolymers, and a parylene resin.

10. The subject matter of claim 9 wherein the total thickness of the layers of silicon dioxide and silicon nitride is approximately 2000 to 4000 A.

11. The subject matter of claim 9 wherein the thickness of the layer of silicon dioxide is approximately 550 A. and the thickness of the layer of silicon nitride is approximately 2000 A.

12. The subject matter of claim 9 wherein the layer of protective resinous coating material includes an electrically insulating material comprising at least one finely divided material selected from the group consisting of aluminum oxide, aluminum, nitride, silicon, dioxide, silicon nitride, boron nitride, magnesium oxide, glass fibers, quartz, mica, and reactivated polytetrafluoroethylene.

References Cited

UNITED STATES PATENTS 3,523,819 8/1970 Tokuyama et al. ---- 117—213

WILLIAM L. JARVIS, Primary Examiner

U.S. Cl. X.R.

117—201, 218; 156—17